(12) United States Patent
Kobayashi

(10) Patent No.: US 8,379,401 B2
(45) Date of Patent: Feb. 19, 2013

(54) WIRING BOARD, METHOD OF MANUFACTURING THE SAME, AND SEMICONDUCTOR DEVICE HAVING WIRING BOARD

(75) Inventor: Toshio Kobayashi, Nagano (JP)

(73) Assignee: Shinko Electric Industries Co., Ltd., Nagano-shi, Nagano (JP)

(*) Notice: Subject to any disclaimer, the term of this patent is extended or adjusted under 35 U.S.C. 154(b) by 1142 days.

(21) Appl. No.: 12/196,432

(22) Filed: Aug. 22, 2008

(65) Prior Publication Data

US 2009/0052150 A1    Feb. 26, 2009

(30) Foreign Application Priority Data

Aug. 24, 2007   (JP) .................... 2007-218146

(51) Int. Cl.
*H05K 7/10*    (2006.01)
*H05K 7/12*    (2006.01)

(52) U.S. Cl. ...................... 361/767; 361/720
(58) Field of Classification Search .......... 174/260–262; 361/720, 736, 748, 760, 767, 777
See application file for complete search history.

(56) References Cited

U.S. PATENT DOCUMENTS

| | | | | |
|---|---|---|---|---|
| 3,646,399 | A * | 2/1972 | Mars et al. ................. | 361/718 |
| 5,436,412 | A * | 7/1995 | Ahmad et al. ............. | 174/265 |
| 5,906,042 | A * | 5/1999 | Lan et al. .................... | 29/852 |
| 6,410,858 | B1 * | 6/2002 | Sasaki et al. ............... | 174/255 |
| 6,418,615 | B1 * | 7/2002 | Rokugawa et al. ......... | 29/852 |
| 6,869,665 | B2 * | 3/2005 | Tani et al. .................. | 428/209 |
| 7,002,080 | B2 * | 2/2006 | Tani et al. .................. | 174/258 |
| 7,250,355 | B2 * | 7/2007 | Rokugawa et al. ......... | 438/464 |
| 7,397,000 | B2 * | 7/2008 | Shimoto et al. ............ | 174/258 |
| 7,417,873 | B2 * | 8/2008 | Kadoya et al. ............. | 361/797 |
| 7,626,829 | B2 * | 12/2009 | Watanabe et al. .......... | 361/767 |
| 7,696,613 | B2 * | 4/2010 | Nakamura et al. ......... | 257/668 |
| 7,795,071 | B2 * | 9/2010 | Hwee-Seng et al. ....... | 438/106 |
| 2005/0046002 | A1 * | 3/2005 | Lee et al. ................... | 257/678 |
| 2005/0088833 | A1 * | 4/2005 | Kikuchi et al. ............ | 361/763 |
| 2008/0169548 | A1 * | 7/2008 | Baek ........................... | 257/686 |
| 2009/0266164 | A1 * | 10/2009 | Furukubo et al. .......... | 73/514.32 |

FOREIGN PATENT DOCUMENTS

| | | |
|---|---|---|
| JP | 2000-323613 | 11/2000 |
| JP | 2007-335464 A | 12/2007 |

OTHER PUBLICATIONS

Office Action from corresponding Japanese patent application No. 2007-218146 issued on Jun. 5, 2012 and English translation thereof (7 pages).

* cited by examiner

*Primary Examiner* — Hung S Bui
(74) *Attorney, Agent, or Firm* — Drinker Biddle & Reath LLP

(57) ABSTRACT

There is provided a wiring board. The wiring board includes: a plurality of laminated insulating layers including a first insulating layer, the first insulating layer being either one of an uppermost layer or a lowermost layer; wiring patterns formed in the plurality of insulating layers; external connection pads provided on the first insulating layer; external connection terminals provided on the external connection pads; and a molding resin provided on a surface of the first insulating layer on which the external connection pads are provided, the molding resin having openings from which the external connection pads are exposed. A thickness of the molding resin is set such that the molding resin does not protrude above the external connection terminals.

8 Claims, 16 Drawing Sheets

WIRING BOARD, METHOD OF MANUFACTURING THE SAME, AND SEMICONDUCTOR DEVICE HAVING WIRING BOARD

This application is based on and claims priority from Japanese Patent Application No. 2007-218146, filed on Aug. 24, 2007, the entire contents of which are incorporated by reference herein.

BACKGROUND

1. Technical Field

The present disclosure relates to a wiring board, a method of manufacturing the same, and a semiconductor device having the wiring board, and more particularly to a wiring board formed as a coreless structure (a structure without a core substrate), a method of manufacturing the same, and a semiconductor device having the wiring board.

2. Related Art

In the related art wiring boards, there has been known coreless boards whose thickness can be reduced by eliminating a core substrate. For instance, a semiconductor device 200 shown in FIG. 1 has been known as a semiconductor device in which electronic components are mounted on the coreless board.

FIG. 1 is a cross-sectional view of a related-art semiconductor device.

By reference to FIG. 1, the related-art semiconductor device 200 has a wiring board 201 serving as a coreless board; electronic components 202 and 203; and an external connection terminal 204.

The wiring board 201 has laminated insulating layers 211, 217, and 221; pads 212 and 213; wiring patterns 215, 216, 218, and 219; vias 222 and 226; external connection pads 223 and 227; and solder resists 231 and 232.

The insulating layer 211 is a layer in which the pads 212 and 213 to which the electronic components 202 and 203 are connected are formed. The pads 212 are provided on a surface 211A (a surface of the insulating layer 211 on which the electronic components 202 and 203 are mounted) of the insulating layer 211 such that side surfaces of the respective pads 212 are covered with the insulating layer 211. Each of the pads 212 has a multilayer structure consisting of an Au layer 241 and an Ni layer 242. The pads 212 are formed such that a surface 241A of the Au layer 241 becomes essentially flush with the surface 211A of the insulating layer 211. A bump 206 is disposed on the Au layer 241 of each of the pads 212. The pads 212 are electrically connected to the electronic component 202 via the bumps 206.

The pads 213 are provided on the surface 211A of the insulating layer 211 such that side surfaces of the pads 213 are covered with the insulating layer 211. Each of the pads 213 has a multilayer structure consisting of the Au layer 241 and the Ni layer 242. The pads 213 are formed such that the surface 241A of the Au layer 241 becomes essentially flush with the surface 211A of the insulating layer 211. The electronic component 203 is connected to the Au layer 241 of each of the pads 213.

Each of the wiring patterns 215 has a via 244 and a wire 245. The vias 244 are provided so as to penetrate through portions of the insulating layer 211 facing the pads 212. The vias 244 are connected to the pads 212. The wires 245 are formed integrally with the vias 244 and provided on a surface 211B (a surface of the insulating layer 211 opposite to the surface 211A) of the insulating layer 211. The wires 245 are electrically connected to the pads 212 via the vias 244.

Each of the wiring patterns 216 has a via 246 and a wire 247. The vias 246 are provided so as to penetrate through portions of the insulating layer 211 facing the pads 213. The vias 246 are connected to the pads 213. The wires 247 are formed integrally with the vias 246 and provided on the surface 211B of the insulating layer 211. The wires 247 are electrically connected to the pads 213 via the vias 246.

The insulating layer 217 is provided on the surface 211B of the insulating layer 211 so as to cover portions of the wires 245 and 247. Each of the wiring patterns 218 has a via 251 and a wire 252. The vias 251 are provided so as to penetrate through portions of the insulating layer 217 facing the wires 245. The vias 251 are electrically connected to the wires 245. The wires 252 are formed integrally with the vias 251 and provided on the surface 217B of the insulating layer 217 (a surface of the insulating layer 217 on which the insulating layer 221 is provided). The wiring patterns 218 configured above are electrically connected to the pads 212 via the wiring patterns 215.

Each of the wiring patterns 219 has a via 253 and a wire 254. The vias 253 are provided so as to penetrate through portions of the insulating layer 217 facing the wires 247. The vias 253 are connected to the wires 247. The wires 254 are formed integrally with the vias 253 and provided on the surface 217B of the insulating layer 217. The wiring patterns 219 configured above are electrically connected to the pads 213 via the wiring patterns 216.

The insulating layer 221 is provided on the surface 217B of the insulating layer 217 so as to cover portions of the wires 252 and 254. The vias 222 are provided so as to penetrate through portions of the insulating layer 221 facing the wires 252. The vias 222 are connected to the wires 252. The external connection pads 223 are formed integrally with the vias 222 and provided on a surface 221B of the insulating layer 221 (a surface of the insulating layer 221 on which a solder resist 232 is provided).

The vias 226 are provided so as to penetrate through portions of the insulating layer 221 opposing the wires 254. The vias 226 are connected to the wires 254. The external connection pads 227 are formed integrally with the vias 226 and provided on the surface 221B of the insulating layer 221.

The solder resist 231 is provided so as to cover the surface 211A of the insulating layer 211. Each of the solder resists 231 has an opening 231A from which the pad 212 is to be exposed and an opening 231B from which the pad 213 is to be exposed.

The solder resist 232 is provided so as to cover the surface 221B of the insulating layer 221. Each of the solder resists 232 has an opening 232A from which the external connection pad 223 is to be exposed and an opening 232B from which the external connection pad 227 is to be exposed.

The electronic component 202 is connected to the pads 212 via the bumps 206. Thereby, the electronic component 202 is electrically connected to the pads 212. An underfill resin 207 is filled between the electronic component 202 and the wiring board 201.

The electronic component 203 is fixed onto the pads 213 by means of the solder 208. The electronic component 203 is electrically connected to the pads 213. The external connection terminals 204 are provided on the external connection pads 223 and 227 exposed from the openings 232A and 232B.

The external connection terminals 204 are provided on the external connection pads 223 and 227. The external connection terminals 204 are terminals connected to pads provided on a mounting board (not shown), such as a mother board.

When a thickness M1' of a portion which includes solder resist 231 and insulating layers 211, 217, 221 is set from 200

μm to 300 μm, a thickness M2' of the solder resist 232 may be set from 20 μm to 50 μm, for example.

As described above, the electronic components 202 and 203 are mounted on the wiring board 201 serving as a coreless board, so that the size of the semiconductor device 200 in thickness direction can be reduced (see e.g., JP-A-2000-323613).

In the related art wiring board 201, the size of the wiring board 201 in the thickness direction can be reduced. However, since there is no core substrate serving as a support board for supporting the laminated insulating layers 211, 217, and 221, there is a problem that warpage is likely to arise.

Specifically, when warpage of the wiring board 201 is large, it is very hard to connect (mount) the electronic components 202 and 203 onto the pads 212 and 213 of the wiring board 201 with a high accuracy, and thus a connection failure between the electronic components 202 and 203 and the wiring board 201 occurs. Further, it is very hard to connect (mount) the external connection terminal 204 of the wiring board 201 onto pads of a mounting board (not shown) such as a mother board, with a high accuracy, and thus a connection failure between the wiring board 201 and the mount board occurs.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a wiring board in which warpage can be reduced without requiring an increase in the size of the wiring board, a method of manufacturing the wiring board, and a semiconductor device having the wiring substrate.

According to one or more aspects of the present invention, there is provided a wiring board includes: a plurality of laminated insulating layers including a first insulating layer, the first insulating layer being either one of an uppermost layer or a lowermost layer; wiring patterns formed in the plurality of insulating layers; external connection pads provided on the first insulating layer; external connection terminals provided on the external connection pads; and a molding resin provided on a surface of the first insulating layer on which the external connection pads are provided, the molding resin having openings from which the external connection pads are exposed, wherein a thickness of the molding resin is set such that the molding resin does not protrude above the external connection terminals.

According to one or more aspects of the present invention, the plurality of insulating layers includes a second insulating layer, the second insulating layer being the other of the uppermost layer or the lowermost layer, wherein the wiring board further comprises: electronic component mounting pads provided on the second insulating layer and electrically coupled to the external connection pads via the wiring patterns.

According to one or more aspects of the present invention, there is provided a semiconductor device including: the wiring board; and an electronic component electrically coupled to the electronic component mounting pads.

According to one or more aspects of the present invention, in a method of manufacturing a wiring board which includes: a plurality of laminated insulating layers including a first insulating layer, the first insulating layer being either one of an uppermost layer or a lowermost layer; and wiring patterns formed in the plurality of insulating layers, the method includes: (a) providing external connection pads on the first insulating layer; (b) providing a molding resin on the first insulating layer such that the external connection pads are exposed from the molding resin and such that the molding resin does not protrude above external connection terminals to be provided on the external connection pads.

According to one or more aspects of the present invention, step (b) includes: injecting the molding resin into a mold in such a state that entire end faces of projection sections of the mold contact the external connection pads.

Other aspects and advantages of the present invention will be apparent from the following description, the drawings, and the claims.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF EXEMPLARY EMBODIMENTS OF THE PRESENT INVENTION

Exemplary embodiments of the present invention will be described with reference to the drawings hereinafter.

First Embodiment

Figure 1:
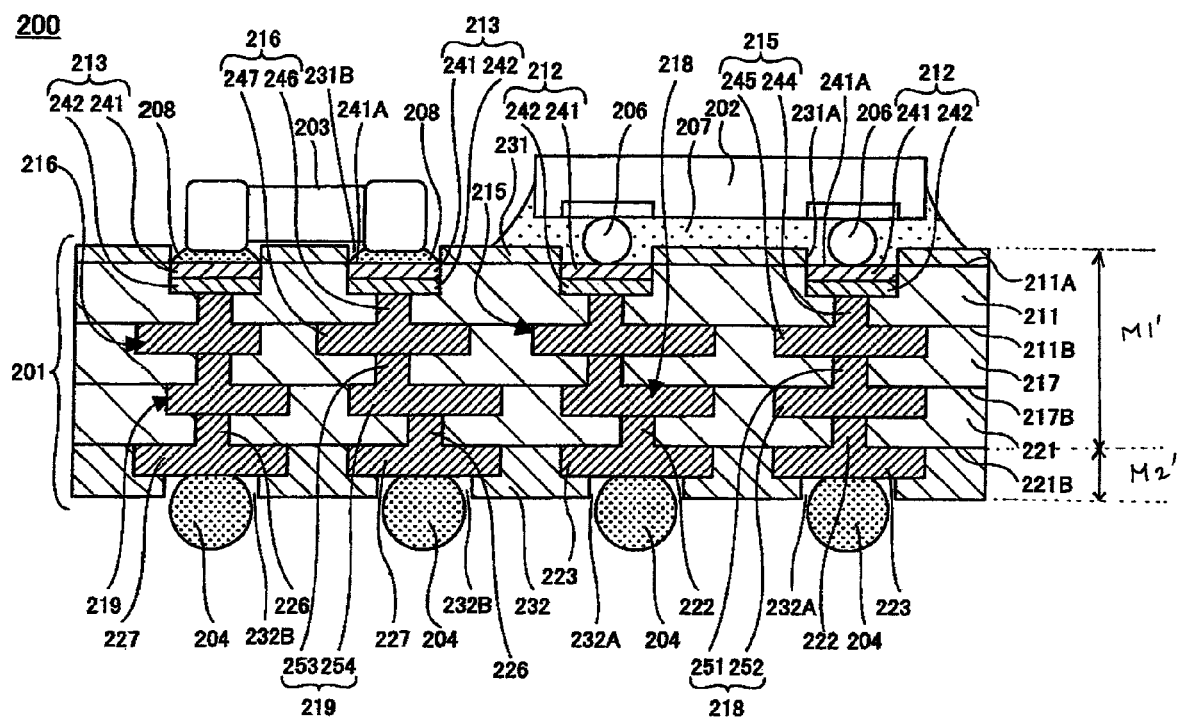
FIG. 1 is a cross-sectional view of a related-art semiconductor device.
Figure 2:
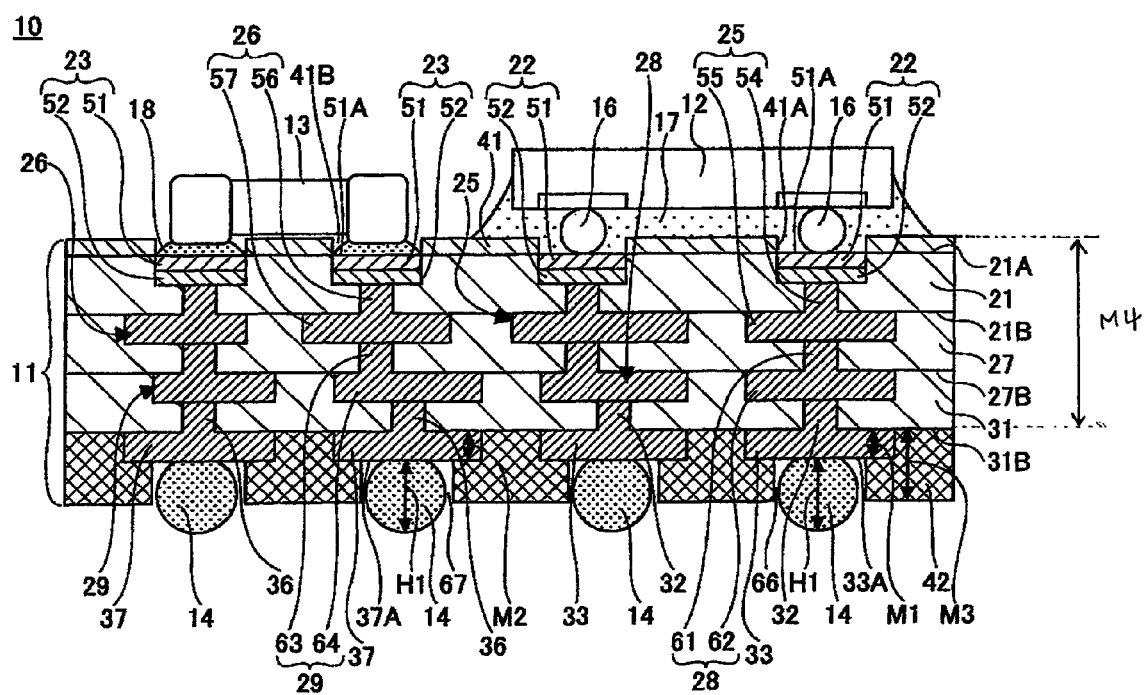
FIG. 2 is a cross-sectional view of a semiconductor device according to a first embodiment of the present invention.

FIG. 2 is a cross-sectional view of a semiconductor device according to a first embodiment of the present invention.

By reference to FIG. 2, a semiconductor device 10 of the first embodiment includes a wiring board 11 serving as a coreless board; electronic components 12 and 13; and external connection terminals 14.

The wiring board 11 includes laminated insulating layers 21, 27, and 31; pads 22 and 23 serving as pads on which electronic components are mounted; wiring patterns 25, 26, 28, and 29; vias 32 and 36; external connection pads 33 and 37; a solder resist 41; and a molding resin 42.

The insulating layer 21 (a second insulating layer) is a layer in which the pads 22 and 23 to which the electronic components 12 and 13 are connected are formed. For instance, an epoxy resin may be used as the insulating layer 21.

The pads 22 are provided on a surface 21A (a surface of the insulating layer 21 on which the electronic components 12 and 13 are mounted) of the insulating layer 21 such that side surfaces of the respective pads 22 are covered with the insulating layer 21. Each of the pads 22 has a multilayer structure consisting of an Au layer 51 and an Ni layer 52. The pads 22 are formed such that a surface 51A of the Au layer 51 (the surface of the Au layer 51 on which the electronic component 12 is mounted) becomes essentially flush with the surface 21A of the insulating layer 21. A bump 16 is disposed on an Au layer 51 of each of the pads 22. The pads 22 are electrically connected to the electronic component 12 via the bumps 16. The thickness of the Au layer 51 can be set to 0.5 μm, for example. The Ni layer 52 can be set to a thickness of 5 μm, for example.

The pads 23 are provided on the surface 21A of the insulating layer 21 such that side surfaces of the pads 23 are covered with the insulating layer 21. Each of the pads 23 has a multilayer structure consisting of the Au layer 51 and the Ni layer 52. The pads 23 are formed such that the surface 51A of the Au layer 51 becomes essentially flush with the surface 21A of the insulating layer 21. The electronic component 13 is mounted on the Au layer 51 of each of the pads 23.

Each of the wiring patterns 25 has a via 54 and a wire 55. The vias 54 are provided so as to penetrate through portions of the insulating layer 21 facing the pads 22. The vias 54 are connected to the Ni layer 52 of each of the pads 22. The wires 55 are formed integrally with the vias 54 and provided on a surface 21B (a surface of the insulating layer 21 on which the insulating layer 27 is provided) of the insulating layer 21. The wires 55 are electrically connected to the pads 22 via the vias 54. For instance, Cu may be used as a material for the wiring patterns 25.

Each of the wiring patterns 26 has a via 56 and a wire 57. The vias 56 are provided so as to penetrate through portions of the insulating layer 21 facing the pads 23. The vias 56 are connected to the pads 23. The wires 57 are formed integrally with the vias 56 and provided on the surface 21B of the insulating layer 21. The wires 57 are electrically connected to the pads 23 via the vias 56. For instance, Cu may be used as a material for the wiring patterns 26.

The insulating layer 27 is provided on the surface 21B of the insulating layer 21 so as to cover portions of the wires 55 and 57. For instance, an epoxy resin may be used as the insulating layer 27.

Each of the wiring patterns 28 has a via 61 and a wire 62. The vias 61 are provided so as to penetrate through portions of the insulating layer 27 facing the wires 55. The vias 61 are connected to the wires 55. The wires 62 are formed integrally with the vias 61 and provided on the surface 27B of the insulating layer 27 (the surface of the insulating layer 27 on which the insulating layer 31 is provided). The wiring patterns 28 configured above are electrically connected to the pads 22 via the wiring patterns 25. For instance, Cu may be used as a material for the wiring patterns 28.

Each of the wiring patterns 29 has a via 63 and a wire 64. The vias 63 are provided so as to penetrate through portions of the insulating layer 27 facing the wires 57. The vias 63 are connected to the wires 57. The wires 64 are formed integrally with the vias 63 and provided on the surface 27B of the insulating layer 27. The wiring patterns 29 configured above are electrically connected to the pads 23 via the wiring patterns 26. For instance, Cu may be used as a material for the wiring patterns 29.

The insulating layer 31 (the first insulating layer provided as the bottom layer or the top layer) is provided on the surface 27B of the insulating layer 27 so as to cover portions of the wires 62 and 64. For instance, an epoxy resin may be used as the insulating layer 31.

The vias 32 are provided so as to penetrate through portions of the insulating layer 31 facing the wires 62. The vias 32 are connected to the wires 62. The external connection pads 33 are formed integrally with the vias 32 and provided on the surface 31B of the insulating layer 31 (the surface of the insulating layer 31 opposite to the surface where the insulating layer 27 is provided). The thickness M1 of the external connection pads 33 can be set to 20 μm, for example For instance, Cu may be used as a material for the vias 32 and the external connection pads 33.

The vias 36 are provided so as to penetrate through portions of the insulating layer 31 facing the wires 64. The vias 36 are connected to the wires 64. The external connection pads 37 are formed integrally with the vias 36 and provided on the surface 31B of the insulating layer 31. The thickness M2 of the external connection pads 37 can be set to 20 μm, for example. For instance, Cu may be used as a material for the vias 36 and the external connection pads 37.

The solder resists 41 are provided so as to cover the surface 21A of the insulating layer 21. Each of the solder resists 41 has an opening 41A from which the pad 22 is to be exposed and an opening 41B from which the pad 23 is to be exposed.

The molding resin 42 is provided in a layered form on the surface 31B of the insulating layer 31 on which the external connection pads 33 and 37 are provided. The molding resin 42 has openings 66 from which surfaces 33A of the respective external connection pads 33, on which the external connection terminals 14 are disposed, are exposed. Also, the molding resin 42 has openings 67 from which surfaces 37A of the respective external connection pads 37, on which the external connection terminals 14 are disposed, are exposed. The thickness M3 of the molding resin 42 (the thickness of the molding resin 42 provided to the surface 31B of the insulating layer 31) is set to a thickness at which the molding resin does not protrude above the external connection terminals 14 provided on the external connection pads 33 and 37. Specifically, when thicknesses M1 and M2 of the external connection pads 33 and 37 are 20 μm and when the height H1 of the external connection terminal 14 is in a range from 0.5 mm to 0.6 mm, the thickness M3 of the molding resin 42 can be set from 0.2 mm to 0.3 mm. In this case, a thickness M4 of a portion which includes the solder resist 41 and the insulating layers 21, 27, 31 can be set from 200 μm to 300 μm, for example. As the molding resin 42, it is advantageous to use a molding resin having rigidity of 20 GPa or more. Moreover, for instance, an epoxy resin having a thermosetting property can be used as the specific molding resin 42.

As described above, the molding resin 42 from which the external connection pads 33 and 37 are to be exposed is provided on the surface 31B of the insulating layer 31 on which the external connection pads 33 and 37 are provided. Thereby, the molding resin 42 serves as a support plate for supporting the plurality of laminated insulating layers 21, 27, and 31, and hence warpage of the wiring board 11 can be reduced.

The thickness M3 of the molding resin 42 is set to a thickness which prevents the molding resin from protruding above the external connection terminals 14 provided on the external connection pads 33 and 37, whereby warpage of the wiring board 11 can be reduced without requiring an increase in the size (thickness) of the wiring board 11.

The electronic component 12 is flip-chip bonded to the pads 22 by means of the bumps 16. Thereby, the electronic component 12 is electrically connected to the pads 22. An underfill resin 17 is filled between the electronic component 12 and the wiring board 11. For instance, a semiconductor chip can be used as the electronic component 12.

The electronic component 13 is fixed onto the pads 23 by means of solder 18. The electronic component 13 is electrically connected to the pads 23. For instance, a chip capacitor, a chip resistor may be used as the electronic component 13.

The external connection terminals 14 are provided on areas of the external connection pads 33 and 37, which are exposed from the openings 66 and 67 formed in the molding resin 42. The external connection terminals 14 are terminals to be connected to a mounting board (not shown) such as a mother board. The height of the external connection terminal 14 (a height achieved when the surfaces 33A and 37A of the external connection pads 33 and 37 are taken as references) can be set from 500 μm to 600 μm, for example. For instance, a solder ball can be used as the external connection terminals 14.

According to the wiring board of the present embodiment, the molding resin 42 from which the external connection pads 33 and 37 are to be exposed is provided on the surface 31B of the insulating layer 31 on which the external connection pads 33 and 37 are provided. Thereby, the molding resin serves as a support plate for supporting the plurality of laminated insulating layers 21, 27, and 31, and hence warpage of the wiring board 11 can be reduced.

The thickness M3 of the molding resin 42 is set to a thickness which prevents the molding resin from protruding above the external connection terminals 14 provided on the external connection pads 33 and 37, whereby warpage of the wiring board 11 can be reduced without requiring an increase in the size (thickness) of the wiring board 11.

Further, since the semiconductor device 10 includes the wiring board 11 having the above-described molding resin 42, warpage of the wiring board 11 can be reduced without requiring an increase in the size of the semiconductor device 10.

FIGS. 3 to 13 are views showing processes for manufacturing the semiconductor device according to the first embodiment of the present invention. In FIGS. 3 to 13, constituent elements that are the same as those of the semiconductor device 10 of the first embodiment are assigned the same reference numerals.

Figure 3:
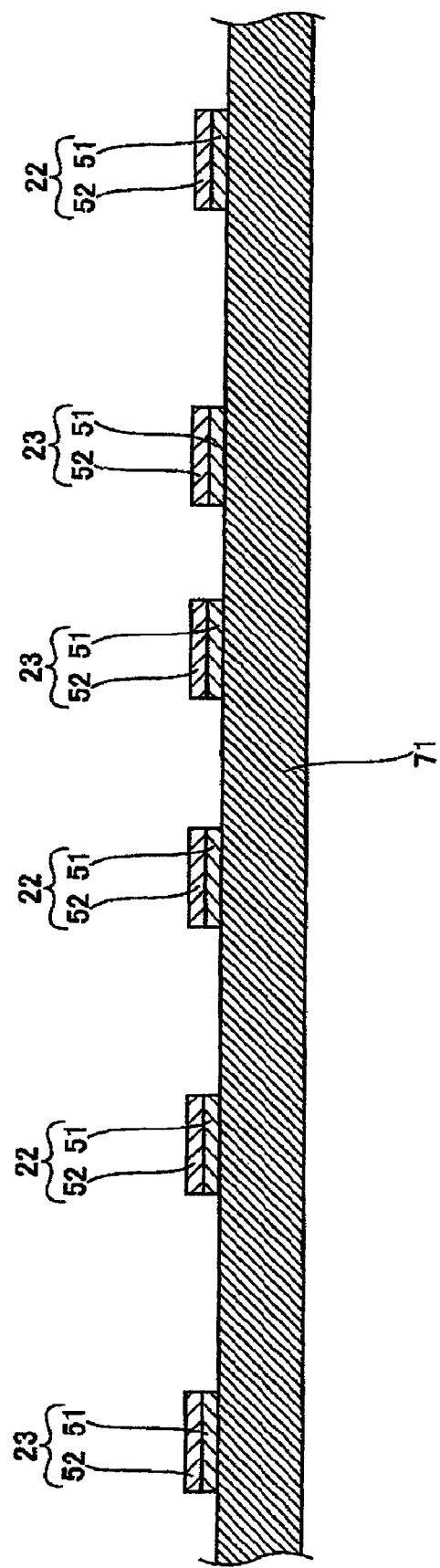
FIG. 3 is a view (#1) showing processes for manufacturing the semiconductor device according to the first embodiment of the present invention.

Firstly, in a process shown in FIG. 3, the Au layer 51 and the Ni layer 52 are sequentially formed on the metal plate 71 that is to serve as a support plate, thereby forming the pads 22 and 23. Specifically, for instance, a resist film (not shown) having openings corresponding to areas where the pads 22 and 23 are to be formed, is formed on the metal plate 71. Next, the Au layer 51 and the Ni layer 52 are sequentially caused to grow on the metal plate 71 through deposition by means of the electrolytic plating technique using the metal plate 71 as a feeding layer, thereby forming the pads 22 and 23. For instance, a Cu plate and a Cu foil can be used as the metal plate 71. The thickness of the Au layer 51 can be set to 0.5 μm, for example. The thickness of the Ni layer 52 can be set to 5 μm, for example.

Figure 4:
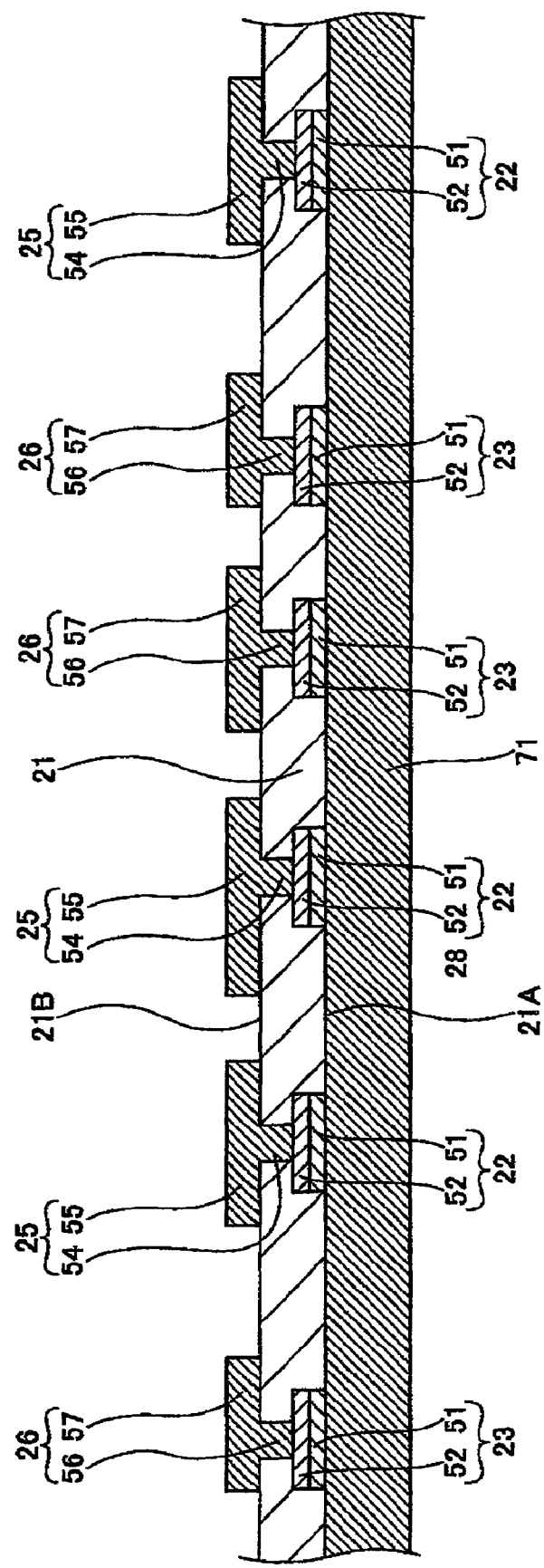
FIG. 4 is a view (#2) showing processes for manufacturing the semiconductor device according to the first embodiment of the present invention.

Next, in the process shown in FIG. 4, a insulating layer 21 (a insulating layer formed as the bottom layer or the top layer) covering portions of the pads 22 and 23 is formed on the metal plate 71. Subsequently, the wiring pattern 25 having the vias 54 and the wires 55 and the wiring pattern 26 having the vias 56 and the wires 57 are simultaneously formed. Specifically, for instance, a sheet-like insulating layer (e.g., a insulating layer formed from an epoxy resin) is formed so as to cover the pads 22 and 23. Next, openings from which portions of the pads 22 and 23 are to be exposed are formed by means of a laser. Subsequently, the wiring patterns 25 and 26 are formed by means of the semi-additive technique. For instance, Cu may be used as a material for the wiring patterns 25 and 26.

Figure 5:
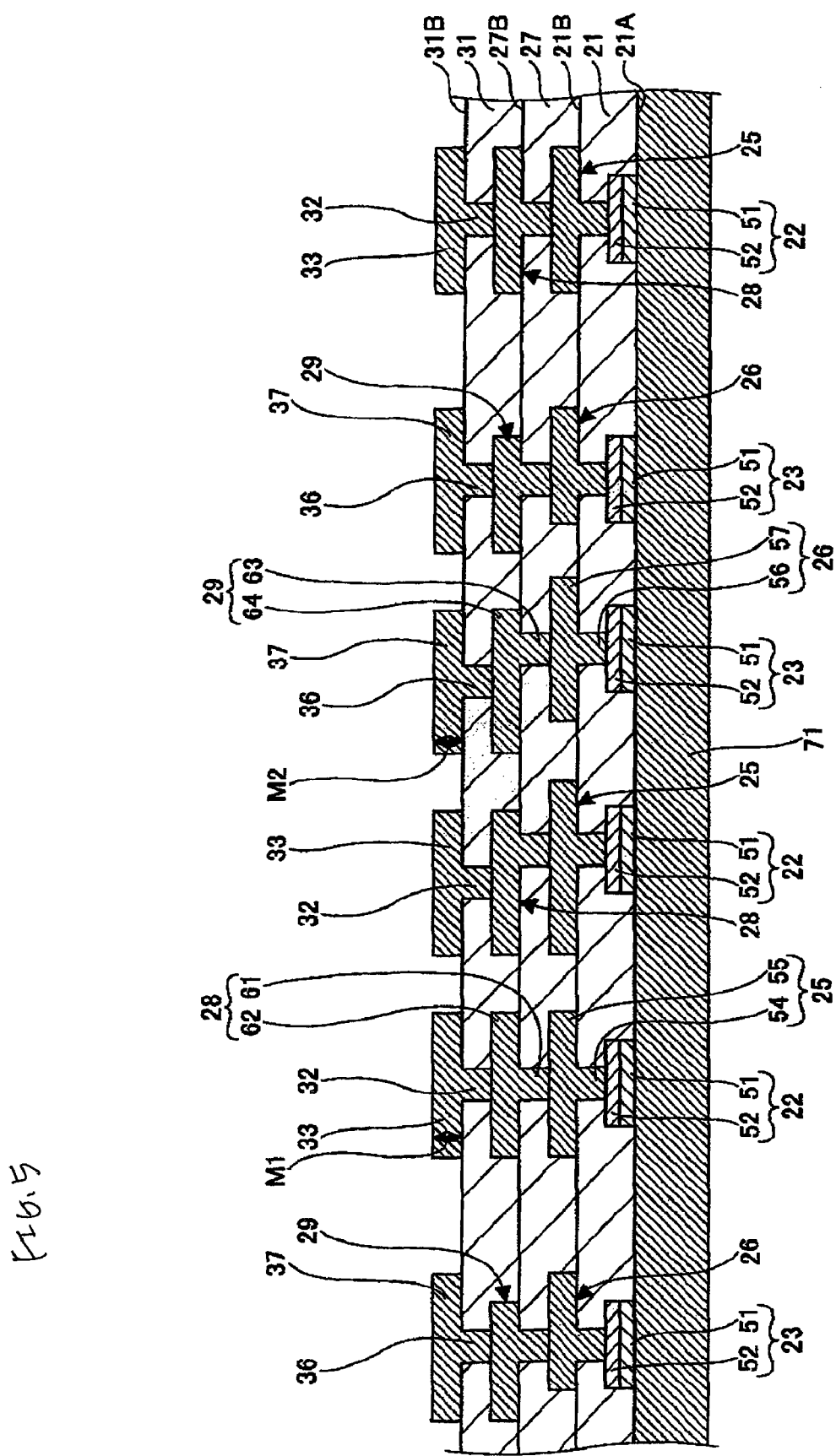
FIG. 5 is a view (#3) showing processes for manufacturing the semiconductor device according to the first embodiment of the present invention.

In a process shown in FIG. 5, the insulating layer 27, the wiring pattern 28 having the vias 61 and the wires 62, the wiring pattern 29 having the vias 63 and the wires 64, the insulating layer 31, the vias 32 and 36, and the external connection pads 33 and 37 are formed by use of a technique analogous to that employed for the process shown in FIG. 4. For instance, an epoxy resin may be used as the insulating layers 27 and 31. For instance, Cu can be used as a material for the wiring patterns 28 and 29, the vias 32 and 36, and the external connection pads 33 and 37. The thickness M1 of the external connection pad 33 can be set to 20 μm, for example. The thickness M2 of the external connection pad 37 can be set to 20 μm, for example.

In the process shown in FIG. 5, an Ni/Au plating layer formed by means of sequential formation of an Ni layer and an Au layer may also be provided on the external connection pads 33 and 37. A solder resist having openings from which the external connection pads 33 and 37 are to be exposed may also be provided on the surface 31A of the insulating layer 31.

Figure 6:
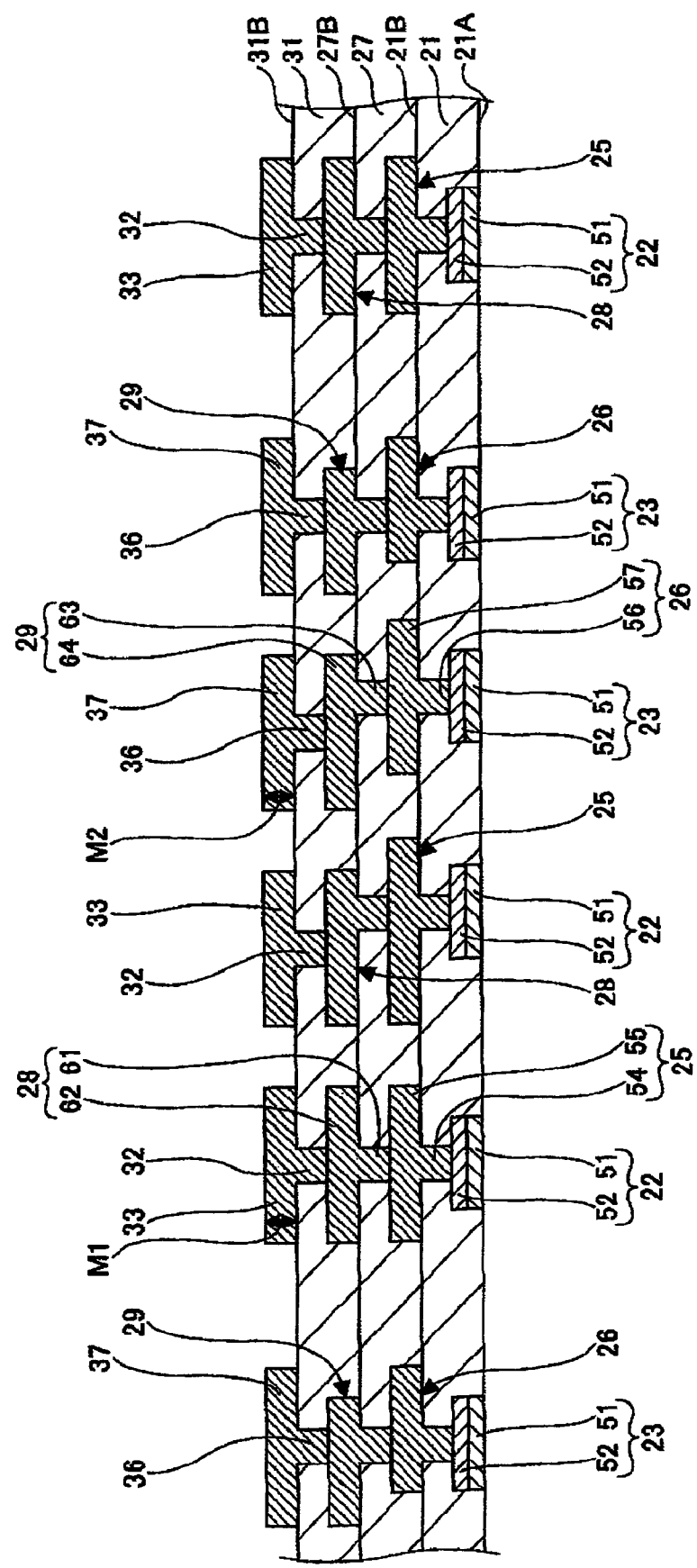
FIG. 6 is a view (#4) showing processes for manufacturing the semiconductor device according to the first embodiment of the present invention.

Next, in a process shown in FIG. 6, the metal plate 71 shown in FIG. 5 is removed. Specifically, for instance, a protective film (not shown) for preventing etching of the external connection pads 33 and 37, which would otherwise be caused by an etchant for the metal plate 71, is pasted onto an upper surface of a structure shown in FIG. 5. Subsequently, the structure provided with the protective film (not shown) is immersed in the etchant, thereby removing the metal plate 71. The protective film (not shown) is then removed from the structure shown in FIG. 5.

Figure 7:
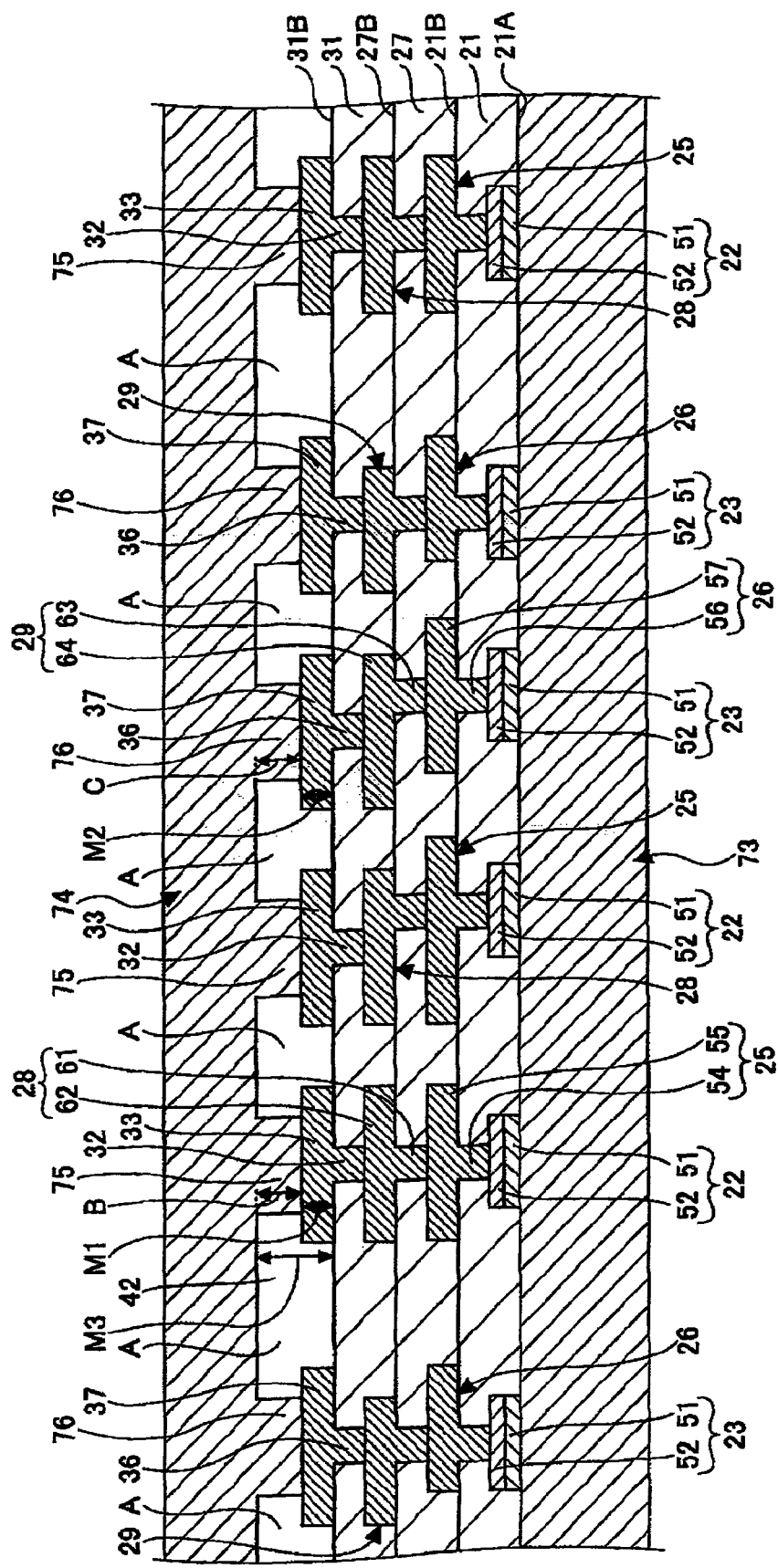
FIG. 7 is a view (#5) showing processes for manufacturing the semiconductor device according to the first embodiment of the present invention.

In a process shown in FIG. 7, a lower mold 73 is provided which contacts a lower surface of the structure shown in FIG. 6 (a surface on which the pads 22 and 23 and the insulating layer 21 are provided) and an upper mold 74 is provided which has a projection section 75 for contacting the external connection pads 33 and a projection section 76 for contacting the external connection pad 37. Subsequently, the structure shown in FIG. 6 is housed between the lower mold 73 and the upper mold 74. At this time, the projection section 75 contacts the external connection pad 33, and the projection section 76 contacts the external connection pad 37, whereby a space A is formed between the upper mold 74 and the structure shown in FIG. 6. In a process shown in FIG. 8, which will be described later, the space A corresponds to a space to be filled with the molding resin 42.

An amount B of projection of the projection section 75 is set such that a value determined by adding a value of thickness M1 of the external connection pad 33 to a value of the amount B of projection of the projection section 75 becomes smaller than the value of the height H1 of the external connection terminal 14. When the thickness M1 of the external connection pad 33 is 20 μm and the height H1 of the external connection terminal 14 is 500 μm to 600 μm, the amount B of projection of the projection section 75 can be set to 200 μm, for example.

An amount C of projection of the projection section 76 is set such that a value determined by adding a value of thickness M2 of the external connection pad 37 to a value of the amount C of projection of the projection section 76 becomes smaller than the value of the height H1 of the external connection terminal 14. When the thickness M2 of the external connection pad 37 is 20 μm and the height H1 of the external connection terminal 14 is 500 μm to 600 μm, the amount C of projection of the projection section 76 can be set to 200 μm, for example.

As described above, by setting the amount B of projection of the projection section 75 and the amount C of projection of the projection section 76, the molding resin 42 provided on the insulating layer 31 is allowed not to project above the external connection terminals 14 provided on the external connection pads 33 and 37. Hence, the semiconductor device 10 and a mounting board (not shown), such as a mother board, can be electrically connected to each other via the external connection terminals 14.

Figure 8:
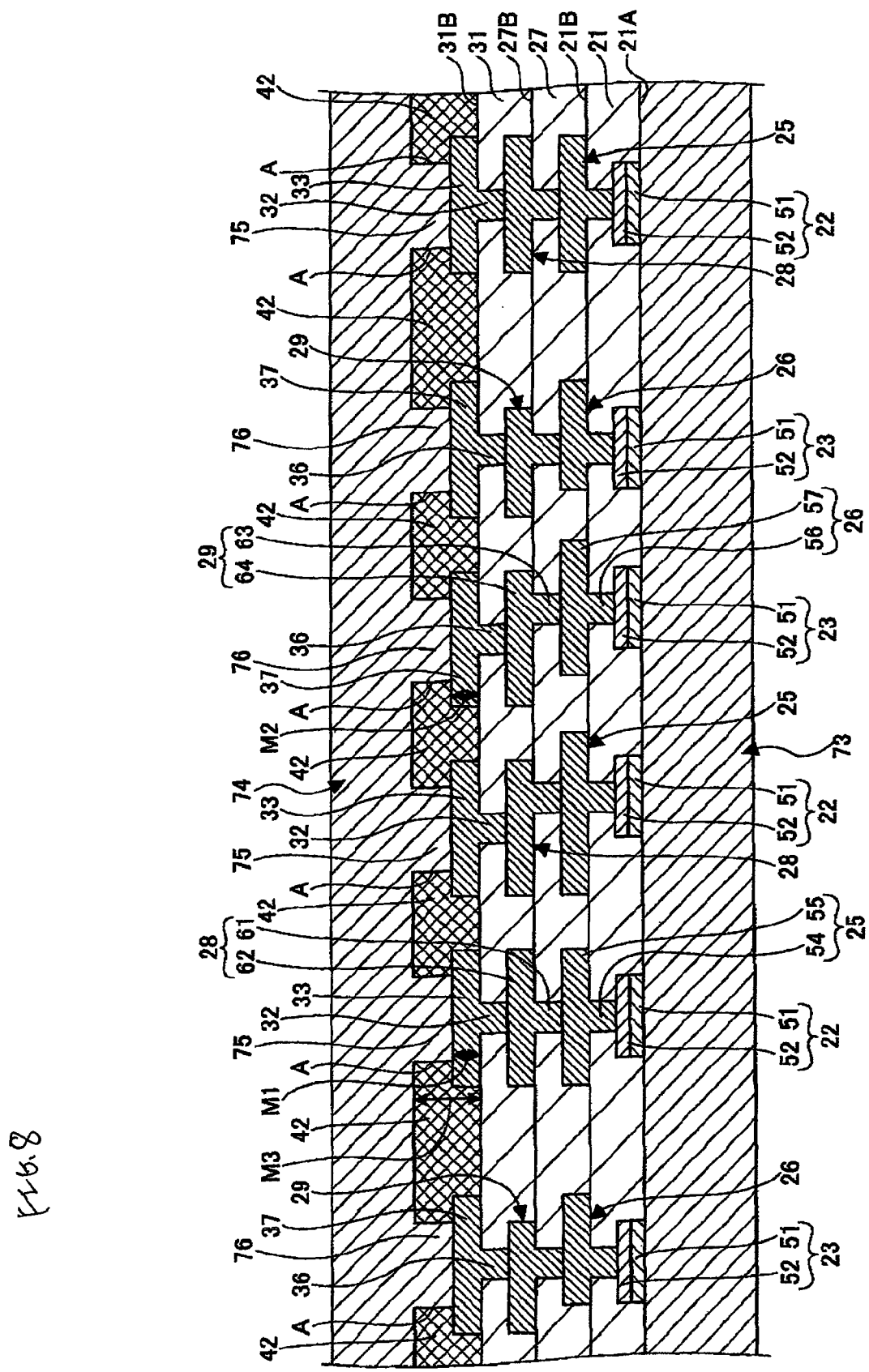
FIG. 8 is a view (#6) showing processes for manufacturing the semiconductor device according to the first embodiment of the present invention.

In the process shown in FIG. 8, the molding resin 42 is injected into the space A formed between the upper mold 74 and the structure shown in FIG. 6, thereby filling the space A with the molding resin 42. A method of injecting the molding resin 42 into the space A can be performed using a transfer molding technique, for example. As described above, by using the transfer molding technique, the molding resin 42 can be formed with a high accuracy. In a process shown in FIG. 9, which will be described later, the molding resin 42 is heated to be cured. For instance, a thermosetting epoxy resin can be used as the molding resin 42.

Next, in the process shown in FIG. 9, the structure shown in FIG. 8 in which the molding resin 42 is formed is pulled out of the lower mold 73 and the upper mold 74, and the molding resin 42 is subsequently heated to be cured. When a thermosetting epoxy resin is used as the molding resin 42, a temperature for heating the molding resin 42 may be set to 180° C. The processes shown in FIGS. 8 and 9 are processes equivalent to a molding resin formation process.

Figure 9:
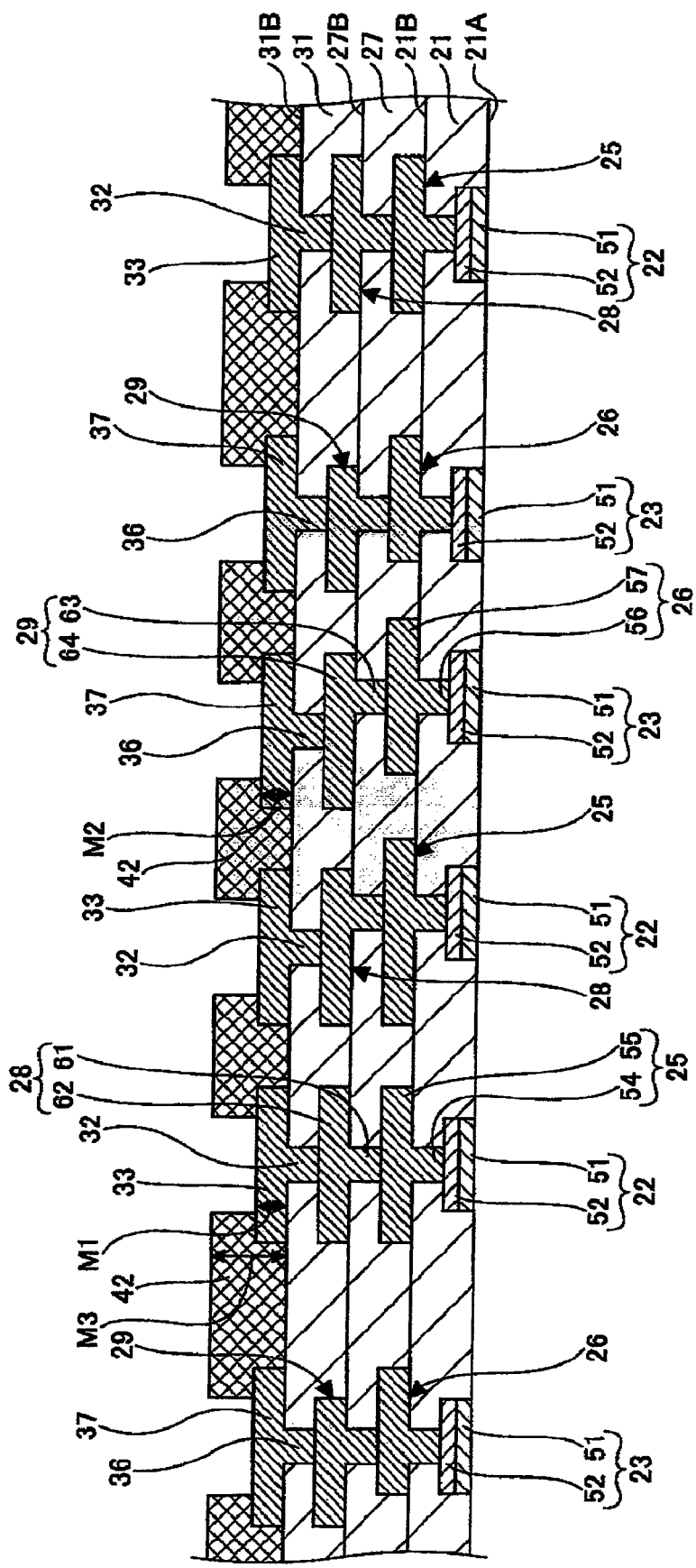
FIG. 9 is a view (#7) showing processes for manufacturing the semiconductor device according to the first embodiment of the present invention.

As described above, there is provided a molding resin forming process for forming the molding resin 42 on the surface 31B of the top insulating layer 31, where the external connection pads 33 and 37 are provided, among the plurality of laminated insulating layers 21, 27, and 31 (the top insulating layer among the plurality of laminated insulating layers 21, 27, and 31 as shown in FIG. 9) such that the external connection pads 33 and 37 are exposed. In the molding resin formation process, the molding resin 42 is formed such that the molding resin does not project above the external connection terminals 14 disposed on the external connection pads 33 and 37, whereby warpage of the wiring board 11 can be reduced without requiring an increase in the size of the wiring board 11.

Figure 10:
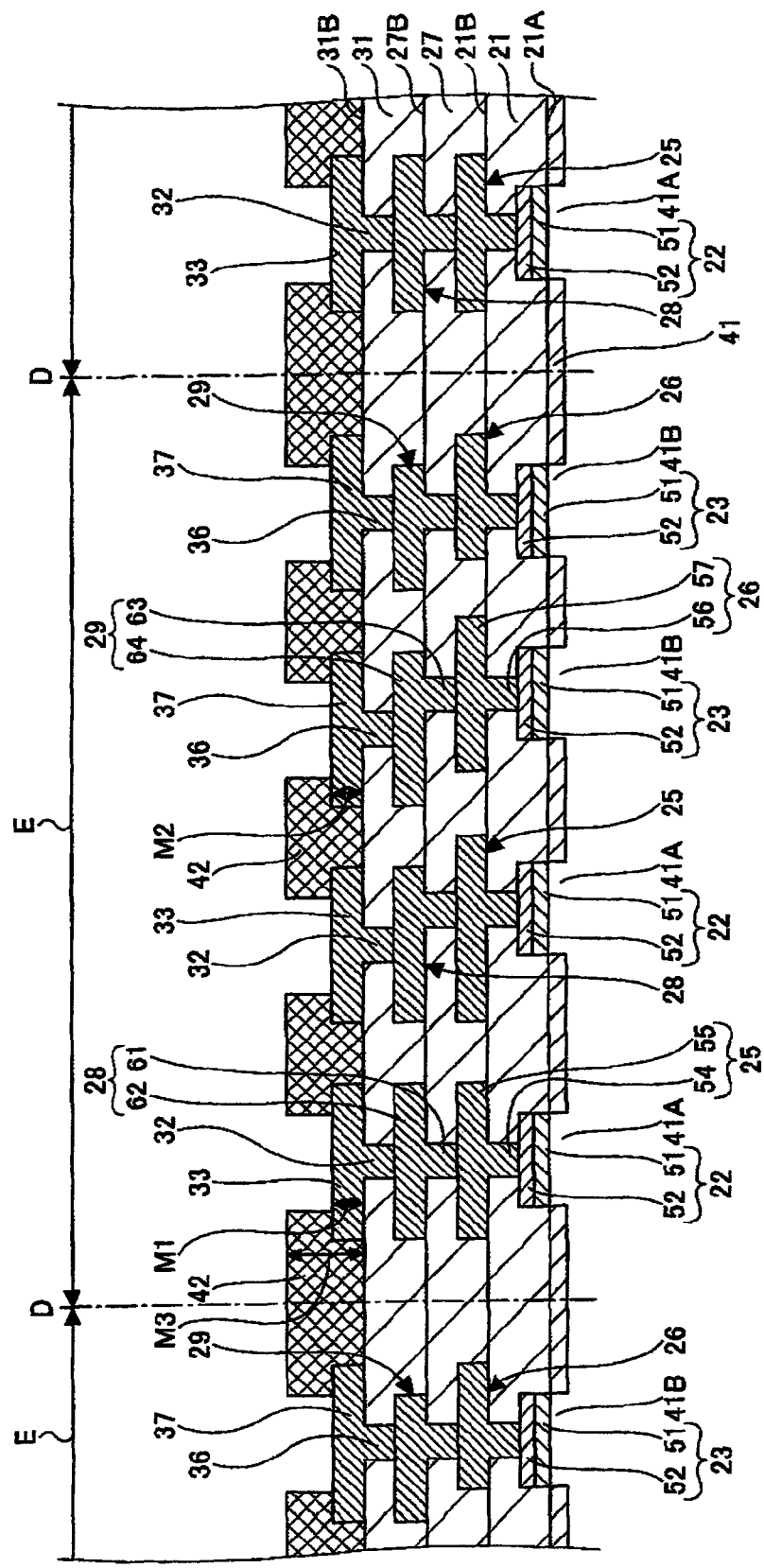
FIG. 10 is a view (#8) showing processes for manufacturing the semiconductor device according to the first embodiment of the present invention.

Next, in a process shown in FIG. 10, the solder resist 41 having the openings 41A from which the pads 22 are to be exposed and the openings 41B from which the pads 23 are to be exposed is formed by means of a known technique. As a result, a plurality of structures, each of which is equivalent to the wiring board 11, are manufactured. The processes shown in FIGS. 3 through 10 correspond to a process of manufacturing the wiring board 11. The solder resist 41 may also be formed just after removal of the metal plate 71 in the process shown in FIG. 6. In FIG. 10, reference symbol D designates a cut position (hereinafter called a "cut position D") where the plurality of wiring boards 11 are cut into pieces, and reference symbol E designates a wiring board formation area where the wiring boards 11 are to be formed.

Figure 11:
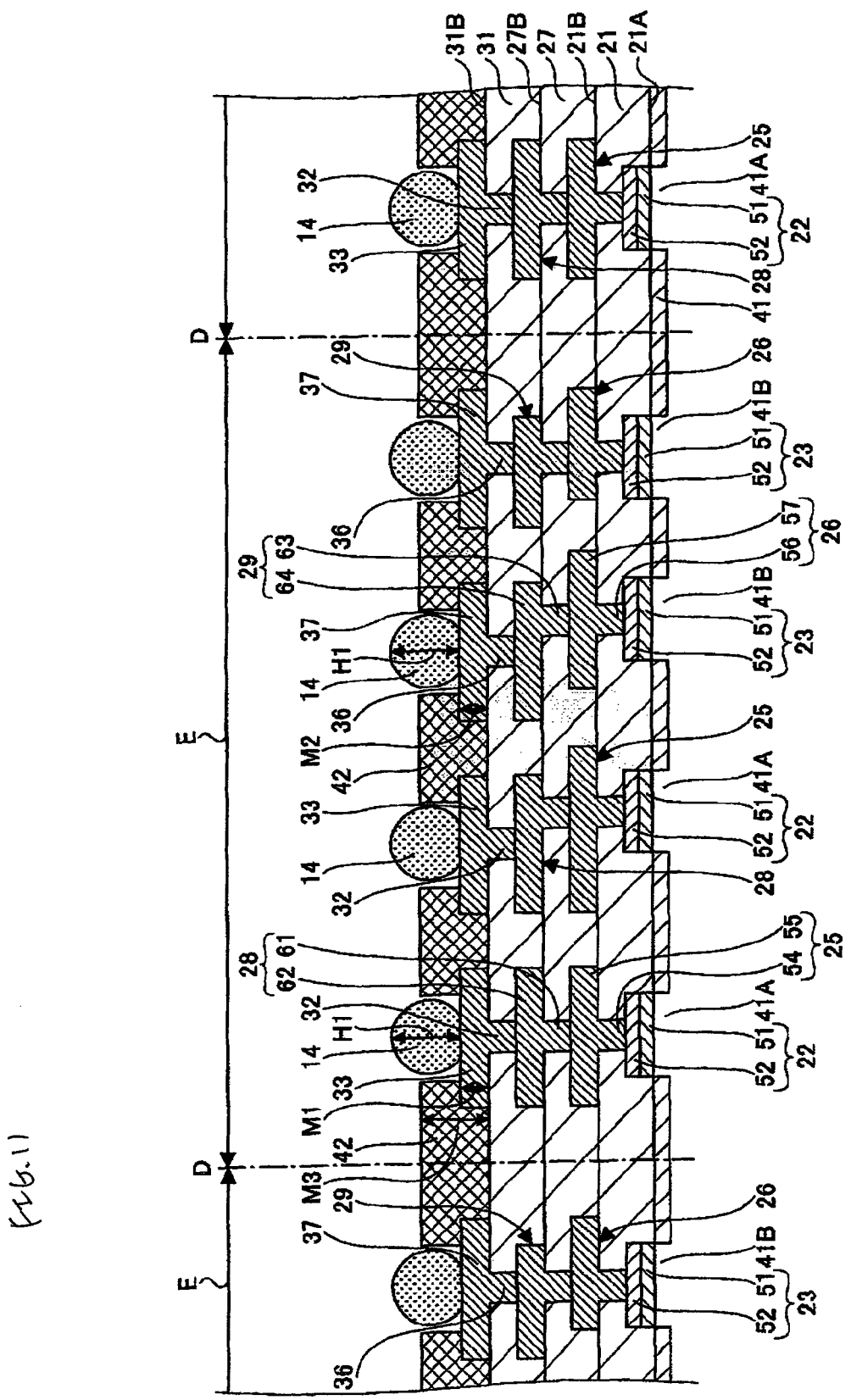
FIG. 11 is a view (#9) showing processes for manufacturing the semiconductor device according to the first embodiment of the present invention.

In the process shown in FIG. 11, the external connection terminals 14 are formed on the external connection pads 33 and 37 exposed from the molding resin 42. For instance, a solder ball may be used as the external connection terminals 14.

Figure 12:
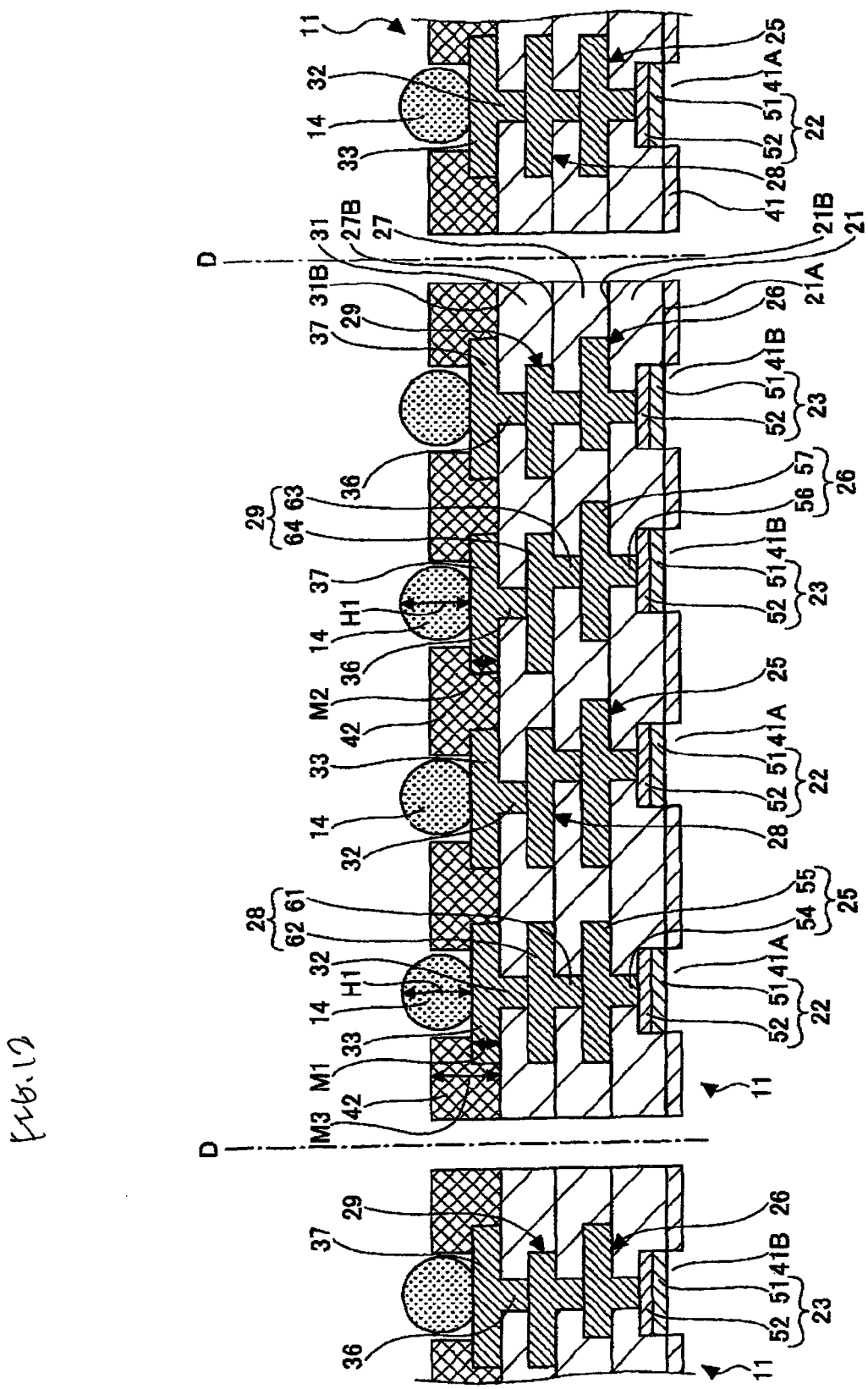
FIG. 12 is a view (#10) showing processes for manufacturing the semiconductor device according to the first embodiment of the present invention.

In a process shown in FIG. 12, the structure shown in FIG. 11 is cut along the cut positions D, whereby the plurality of wiring boards 11 having the external connection terminals 14 are separated into pieces.

Figure 13:
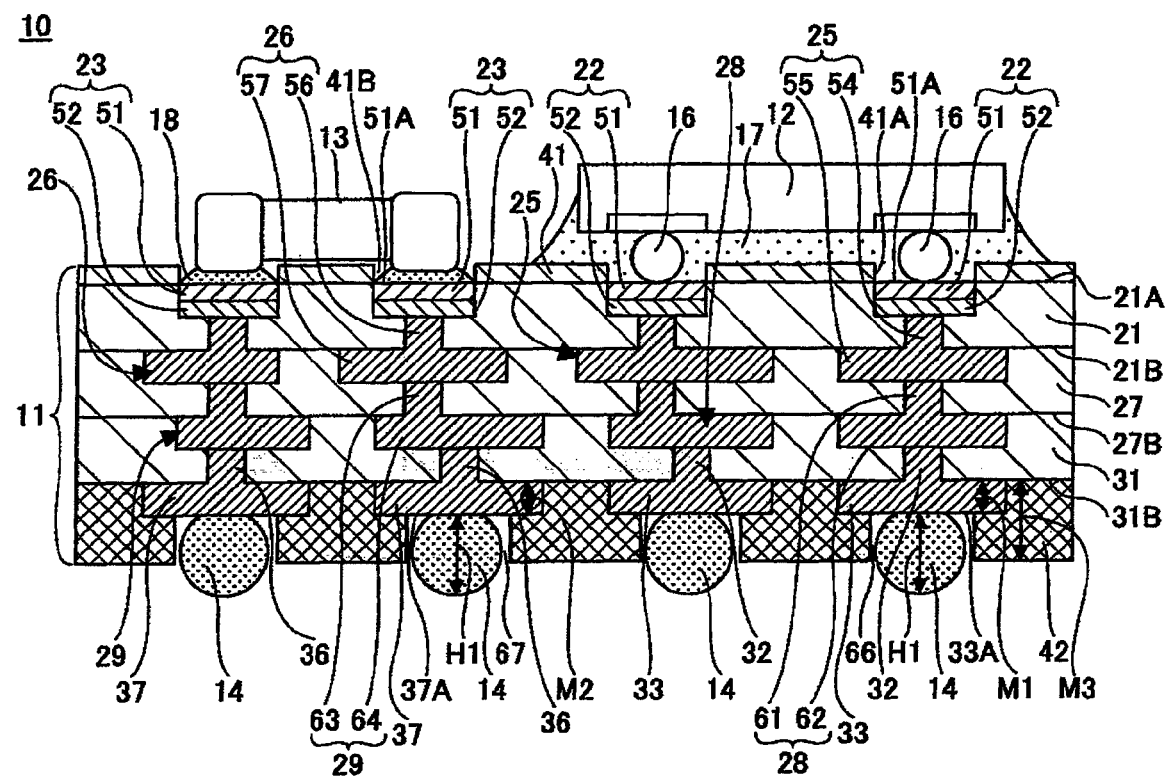
FIG. 13 is a view (#11) showing processes for manufacturing the semiconductor device according to the first embodiment of the present invention.

In a process shown in FIG. 13, the electronic component 12 is mounted on the pads 22 of the plurality of wiring boards 11, and the electronic component 13 is mounted on the pads 23 of the plurality of the wiring boards 11. Specifically, the electronic component 12 is fixed onto the pads 22 by way of; for instance, the bumps 16. Subsequently, the underfill resin 17 is filled between the electronic component 12 and the wiring boards 11, thereby mounting the electronic component 12. In the case of the electronic component 13, for instance, molten solder 18 is provided on the pads 23, and the electronic component 13 is mounted on the pads 23 on which the molten solder 18 is formed, thereby mounting the electronic component. Thus, the semiconductor device 10 is manufactured.

As described above, according to the method for manufacturing a wiring board of the present embodiment, there is provided a molding resin forming process for forming the molding resin 42, in a layered fashion, on the surface 31B of the top insulating layer 31, where the external connection pads 33 and 37 are provided, among the plurality of laminated insulating layers 21, 27, and 31 (the top insulating layer in the plurality of laminated insulating layers 21, 27, and 31 as shown in FIG. 9) such that the external connection pads 33 and 37 are exposed. In the molding resin formation process, the molding resin 42 is formed such that the molding resin does not project above the external connection terminals 14 disposed on the external connection pads 33 and 37, whereby warpage of the wiring board 11 can be reduced without requiring an increase in the size (thickness) of the wiring board 11.

Second Embodiment

Figure 14:
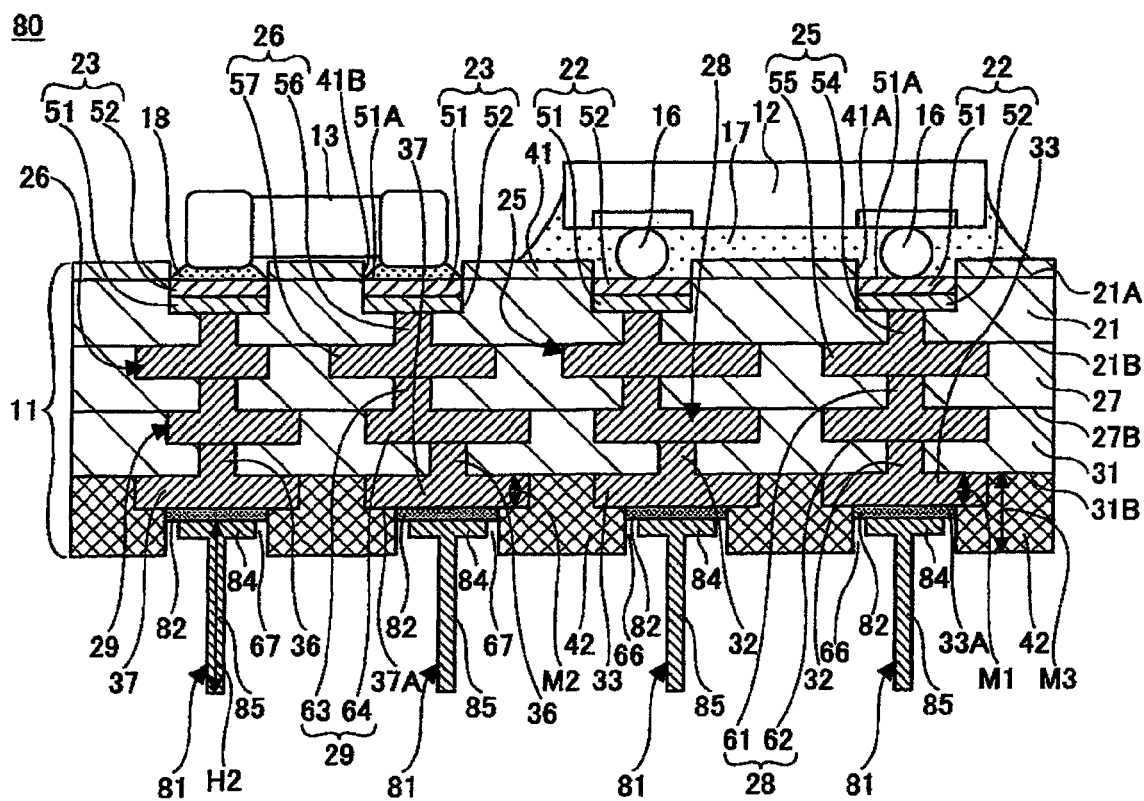
FIG. 14 is a cross-sectional view of a semiconductor device according to a second embodiment of the present invention.

FIG. 14 is a cross-sectional view of a semiconductor device according to a second embodiment of the present invention. In FIG. 14, constituent elements that are the same as those of the semiconductor device 10 of the first embodiment are assigned the same reference numerals.

By reference to FIG. 14, a semiconductor device 80 of the second embodiment is configured in the same manner as is the semiconductor device 10 except that external connection terminals 81 are provided in place of the external connection terminals 14 provided in the semiconductor device 10 of the first embodiment.

The external connection terminals 81 are formed into the shape of a pin, and each of the external connection terminals has a support 84 (a nail head) and a pin main body 85. The supports 84 are formed into a flat shape and fixed to the external connection pads 33 and 37 exposed from the molding resin 42 by means of solder 82. The supports 84 are members for supporting the pin main bodies 85. The pin main body 85 is provided on each of the supports 84. The pin main body 85 and the support 84 are configured into a single piece.

A height H2 of the external connection terminal 81 as configured above can be set to 2 m, for example. The thickness M3 of the molding resin 42 is set to a thickness at which the molding resin does not protrude above the external connection terminals 81 provided on the external connection pads 33 and 37. Specifically, when the height H2 of the external connection terminals 81 is 2 mm, the thickness M3 of the molding resin 42 can be set to 200 μm to 500 μm, for example. For instance, a Cu alloy can be used as a material for the external connection terminals 81.

The above-configured semiconductor device 80 can be manufactured by cutting the structure, which is shown in FIG. 10 and described in the first embodiment, along the cut positions D; fixing the external connection terminals 81 to the external connection pads 33 and 37; and mounting the electronic components 12 and 13 on the pads 22 and 23.

According to the wiring board of the present embodiment, the molding resin 42 from which the external connection pads 33 and 37 are to be exposed is provided on the surface 31B of the insulating layer 31 on which the external connection pads 33 and 37 are provided. Thereby, the molding resin 42 serves as a support plate for supporting the plurality of laminated insulating layers 21, 27, and 31, and hence warpage of the wiring board 11 can be reduced.

The thickness M3 of the molding resin 42 is set to a thickness at which the molding resin does not protrude above the external connection terminal 81 provided on the external connection pads 33 and 37, whereby warpage of the wiring board 11 can be reduced without requiring an increase in the size of the wiring board 11 in the thickness direction.

Moreover, by providing the wiring board 11, which is described in connection with the first embodiment, in the semiconductor device 80, warpage of the wiring board 11 can be reduced without requiring an increase in the size of the semiconductor device 80.

Third Embodiment

Figure 15:
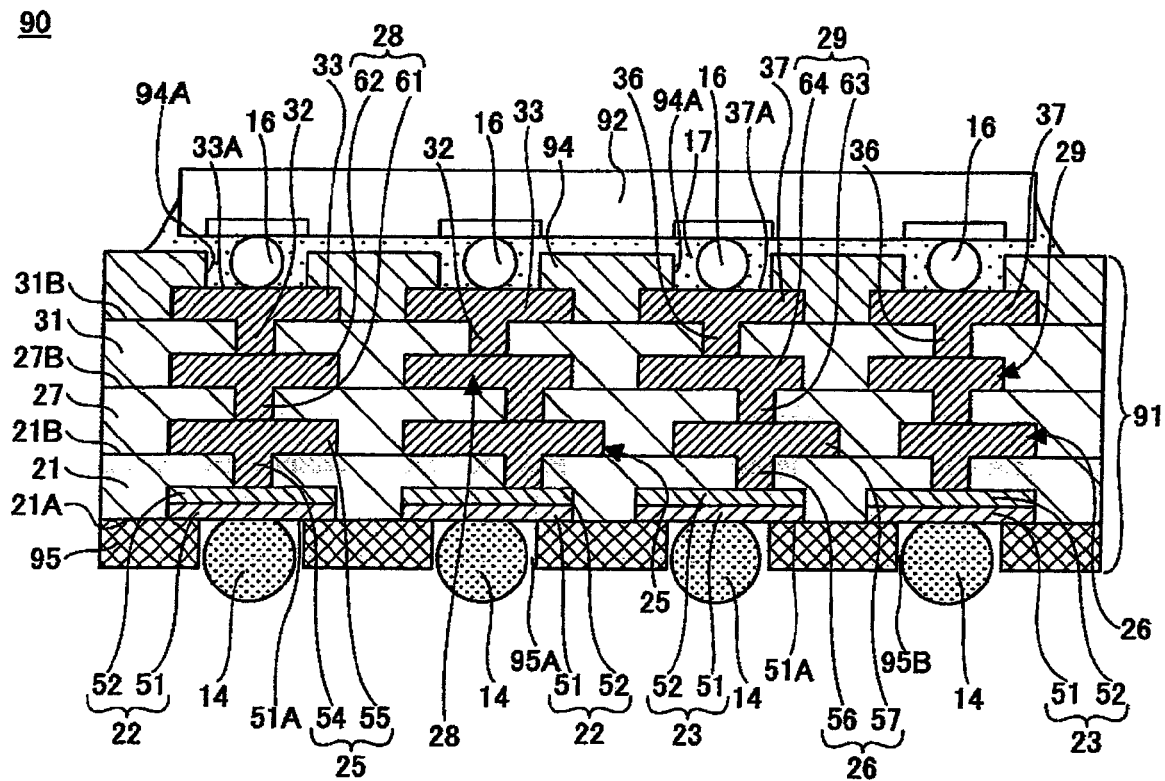
FIG. 15 is a cross-sectional view of a semiconductor device according to a third embodiment of the present invention.

FIG. 15 is a cross-sectional view of a semiconductor device according to a third embodiment of the present invention. In FIG. 15, constituent elements that are the same as those of the semiconductor device 10 of the first embodiment are assigned the same reference numerals.

By reference to FIG. 15, a semiconductor device 90 of the third embodiment includes a wiring board 91 serving as a coreless board, an electronic component 92, and the external connection terminals 14.

The wiring board 91 is configured in the same fashion as is the wiring board 11 except that a solder resist 94 and a molding resin 95 are provided in place of the solder resist 41 and the molding resin 42 provided on the wiring board 11 of the first embodiment.

The solder resist 94 is provided on the surface 31B of the insulating layer 31 so as to cover portions of the external connection pads 33 and 37. The solder resist 94 has openings 94A from which portions of the external connection pads 33 and 37 are to be exposed.

The molding resin 95 is provided in a layered form so as to cover the surface 21A of the insulating layer 21 on which the pads 22 and 23 are formed. The molding resin 95 has openings 95A from which the pads 22 are to be exposed and openings 95B from which the pads 23 are to be exposed. A thickness of the molding resin 95 is set such that the molding resin does not protrude above the external connection terminals 14 provided on the pads 22 and 23. For instance, it is advantageous to use a molding resin having rigidity of 20 GPa or more as the molding resin 95. Moreover, for instance, an epoxy resin having a thermosetting property can be used as the specific molding resin 95.

As described above, the molding resin 95 from which the pads 22 and 23 are to be exposed is provided on the surface 21A of the insulating layer 21 on which the pads 22 and 23 are formed, whereupon the molding resin 95 serves as a support plate supporting the plurality of laminated insulating layers 21, 27, and 31. Hence, warpage of the wiring board 91 can be reduced.

The thickness of the molding resin 95 is set to a thickness at which the molding resin does not protrude above the external connection terminals 14 provided on the pads 22 and 23, whereby warpage of the wiring board 91 can be reduced without requiring an increase in the size (thickness) of the wiring board 91.

The electronic component 92 is flip-chip bonded to the external connection pads 33 and 37 by means of the bumps 16. Thereby, the electronic component 92 is electrically connected to the external connection pads 33 and 37. A space between the electronic component 92 and the wiring board 91 is filled with the underfill resin 17. For instance, a semiconductor chip can be used as the electronic component 92. The external connection terminals 14 are provided on the pads 22 and 23 exposed from the openings 95A and 95B.

According to the semiconductor device of the present embodiment, by providing the molding resin 95, from which the pads 22 and 23 are to be exposed, on the surface 21A of the insulating layer 21 on which the pads 22 and 23 are formed, whereby the molding resin 95 serves as a support plate supporting the plurality of laminated insulating layers 21, 27, and 31, and hence warpage of the wiring board 91 can be reduced. In short, the molding resin 95 may also be provided on the surface 21A of the insulating layer 21 contacting the metal plate 71 described in the first embodiment.

Fourth Embodiment

Figure 16:
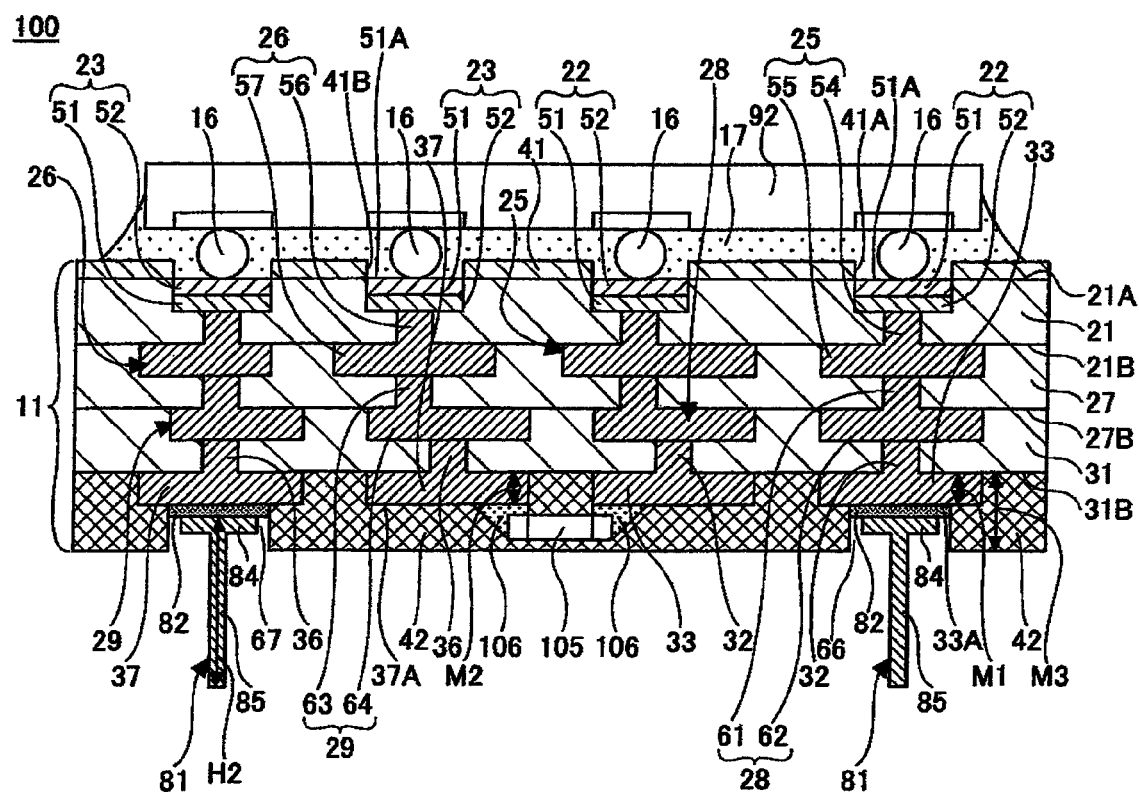
FIG. 16 is a cross-sectional view of a semiconductor device according to a fourth embodiment of the present invention.

FIG. 16 is a cross-sectional view of a semiconductor device according to a fourth embodiment of the present invention. In FIG. 16, constituent elements that are the same as those of the semiconductor device 80 of the second embodiment are assigned to the same reference numerals.

By reference to FIG. 16, a semiconductor device 100 of the fourth embodiment includes a wiring board 101 serving as a coreless board, the electronic component 92, and the external connection terminals 81.

The wiring board 101 is configured in the same fashion as is the wiring board 11 except that an electronic component 105 is incorporated in the wiring board 11 of the first embodiment. The electronic component 105 is sealed with the molding resin 42. The electronic component 105 has a pair of terminals. One of the terminals of the electronic component 105 is electrically connected to the external connection pads 33 by means of solder 106, and the other terminal is electrically connected to the external connection pads 37 by means of the solder 106. For instance, a chip capacitor and a chip resistor can be used as the electronic component 105.

According to the semiconductor device of the present embodiment, the electronic component 105 is electrically connected to the external connection pads 33, 37 and is sealed by means of the molding resin 42, whereby the pair of terminals of the electronic component 105 are insulated from each other by means of the molding resin 42. Therefore, insulation achieved between the pair of terminals of the electronic component 105 can be enhanced. Further, when the size of the electronic component 105 is minute, missing of the electronic component 105 from the wiring board 11 can be prevented.

While the present embodiment has described in connection with the case where the external connection terminals 81 formed into a pin shape are provided, the ball-shaped external connection terminals 14 according to the first embodiment may also be provided in place of the external connection terminals 81.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A wiring board comprising:
    a plurality of laminated insulating layers including a first insulating layer, the first insulating layer being either one of an uppermost layer or a lowermost layer;
    wiring patterns formed in the plurality of insulating layers;
    external connection pads provided on the first insulating layer;
    external connection terminals provided on the external connection pads; and
    a molding resin provided on a surface of the first insulating layer on which the external connection pads are provided, the molding resin having openings from which the external connection pads are exposed,
    wherein a thickness of the molding resin is set such that the molding resin does not protrude above the external connection terminals, and
    wherein the thickness of the molding resin is 200 µm to 500 µm.

2. The wiring board according to claim 1, wherein
    the plurality of insulating layers includes a second insulating layer, the second insulating layer being the other of the uppermost layer or the lowermost layer,
    wherein the wiring board further comprises:
    electronic component mounting pads provided on the second insulating layer and
    electrically coupled to the external connection pads via the wiring patterns.

3. A semiconductor device comprising:
    the wiring board according to claim 2; and
    an electronic component electrically coupled to the electronic component mounting pads.

4. The wiring board according to claim 1, wherein the molding resin is an epoxy resin having a thermosetting property.

5. The wiring board according to claim 1, wherein a rigidity of the molding resin is 20 Gpa or more.

6. The wiring board according to claim 1, wherein the external connection terminals are solder balls or pins.

7. The wiring board according to claim 1, wherein an electronic component is mounted on a surface of the first insulating layer on which the external connection pads are provided, and the electronic component is sealed with the molding resin.

8. The wiring board according to claim 7, wherein the electronic component is a chip capacitor or a chip resistor.

* * * * *